United States Patent
Matsumoto et al.

(10) Patent No.: US 6,643,835 B2
(45) Date of Patent: Nov. 4, 2003

(54) COMPUTER-AIDED DESIGN SUPPORTING SYSTEM IN WHICH CELLS CAN BE ARRANGED INDEPENDENTLY

(75) Inventors: Takeshi Matsumoto, Tokyo (JP); Atsuko Kozai, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 109 days.

(21) Appl. No.: 09/729,198

(22) Filed: Dec. 5, 2000

(65) Prior Publication Data

US 2001/0004762 A1 Jun. 21, 2001

(30) Foreign Application Priority Data

Dec. 21, 1999 (JP) ............................................. 11-363342

(51) Int. Cl.⁷ ............................................... G06F 17/50
(52) U.S. Cl. ................................. 716/11; 716/8; 716/12
(58) Field of Search ..................... 716/2, 8–14

(56) References Cited

U.S. PATENT DOCUMENTS

| | | | |
|---|---|---|---|
| 5,483,461 A * | 1/1996 | Lee et al. ..................... | 364/490 |
| 5,623,420 A * | 4/1997 | Yee et al. ..................... | 364/490 |
| 5,796,299 A | 8/1998 | Sei et al. | |
| 5,808,900 A * | 9/1998 | Buer et al. ..................... | 364/491 |
| 5,923,569 A | 7/1999 | Kumashiro et al. | |
| 6,340,825 B1 | 1/2002 | Shibata et al. | |
| 6,405,346 B1 * | 6/2002 | Nawa .............................. | 716/2 |
| 6,446,245 B1 * | 9/2002 | Xing et al. .................... | 716/10 |

FOREIGN PATENT DOCUMENTS

| | | |
|---|---|---|
| EP | 0 720 233 A2 | 7/1996 |
| EP | 0 997 945 A1 | 5/2000 |
| JP | 2-185056 | 7/1990 |
| JP | 6-85062 | 3/1994 |
| JP | 7-14926 | 1/1995 |
| JP | 11-126827 | 5/1999 |
| KR | 1996-0026786 | 7/1996 |
| WO | 99/54937 | 10/1999 |

OTHER PUBLICATIONS

Richard I. Hartley et al., "A Digital–Serial Silicon Compiler," 25th ACM/IEEE Design Automation Conference, IEEE, 1988, Paper 40.4, pp. 646–649.

* cited by examiner

*Primary Examiner*—Vuthe Siek
(74) *Attorney, Agent, or Firm*—Young & Thompson

(57) ABSTRACT

A computer-aided design supporting system for a semiconductor device includes a cell library, an arranging tool and a wiring tool. The cell library stores a plurality of logic cell patterns, a plurality of power supply cell patterns, and a plurality of ground cell patterns. A logic device pattern of the semiconductor device includes one of the plurality of logic cell patterns, one of the plurality of power supply cell patterns, and one of the plurality of ground cell patterns. The arranging tool arranges selected ones of the plurality of logic cell patterns, selected ones of the plurality of power supply cell patterns and selected ones of the plurality of ground cell patterns on cell tracks individually and independently in response to an arrange instruction. The wiring tool connects between the selected logic cell patterns, between the selected power supply cell patterns and between the selected ground cell patterns arranged on the cell tracks in response to a wiring instruction to form a pattern of the semiconductor device.

22 Claims, 8 Drawing Sheets

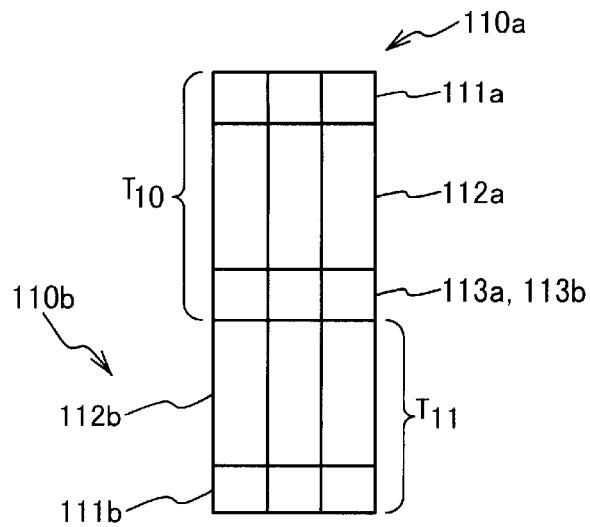
Fig. 3A
PRIOR ART
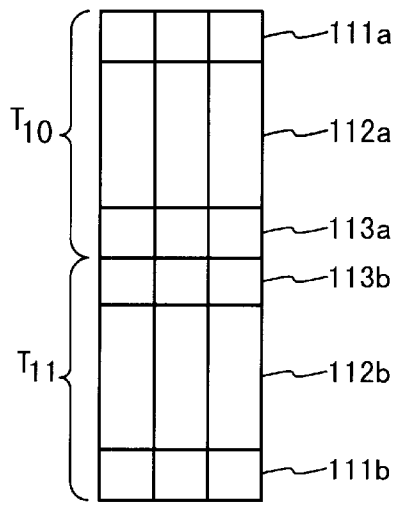
Fig. 3B
PRIOR ART
Fig. 3C
PRIOR ART
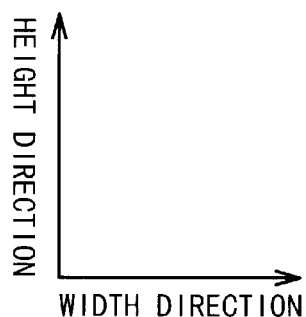
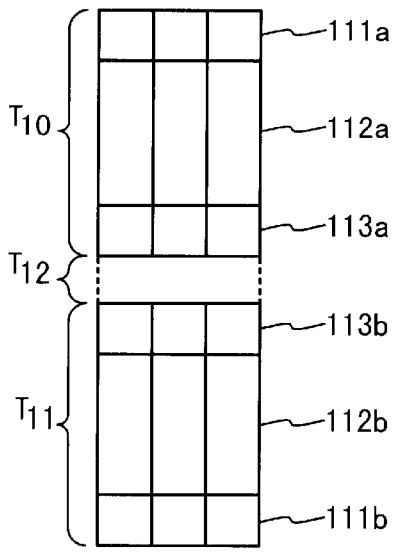

Fig. 5A
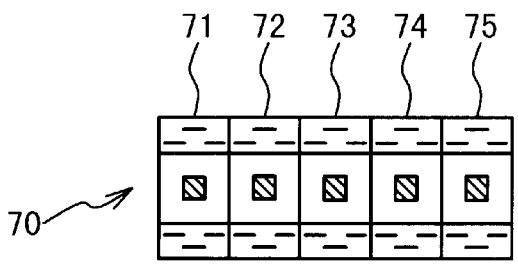
Fig. 5B
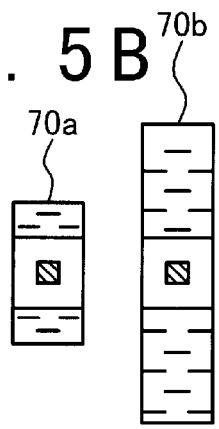
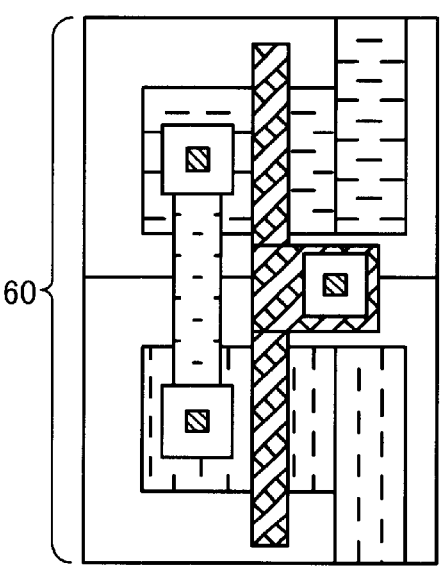
Fig. 5C
Fig. 5D
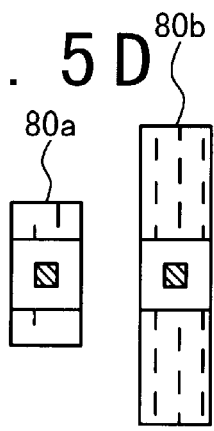
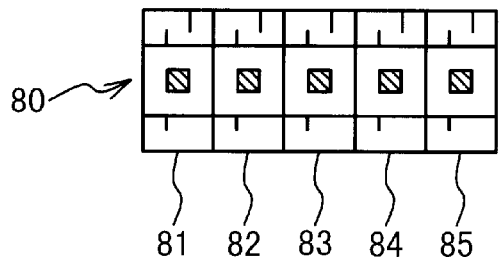
Fig. 5E

COMPUTER-AIDED DESIGN SUPPORTING SYSTEM IN WHICH CELLS CAN BE ARRANGED INDEPENDENTLY

BACKGROUND OF THE INVENTION

1. Field of the Invention

The present invention relates to a computer-aided design supporting system for arranging cells independently with reference to a cell library.

2. Description of the Related Art

To design a semiconductor circuit, a computer-aided design supporting system is often used to automatically arrange and connect function blocks or "cells". Such a computer-aided design supporting system is disclosed in, for example, Japanese Laid Open Patent Application (JP-A-Heisei 6-85062). In this reference, the computer-aided design supporting system has a cell library, which stores patterns of circuits such as basic gates and logic circuits, which have a high use frequency as standard cells. The standard cell is composed of a logic circuit section, a power supply section and a ground section.

FIG. 1 shows the structure of the conventional computer-aided design supporting system 100. The design supporting system 100 is composed of a CAD tool 101 and a cell library 102. The CAD tool 101 is composed of an arranging tool 103 and a wiring tool 104.

The CAD tool 101 carries out automatic arrangement and connection of the cells. The cell library 102 is a database in which various standard cells are registered. The arranging tool 103 reads out the standard cells from the cell library 102 and automatically arranges the read out standard cells on a cell track provided in an arrangement region. The wiring tool 104 automatically connects between the standard cells on the cell track and between the standard cells and wiring lanes on a wiring track in the arrangement region.

FIG. 2 shows the structure of a conventional standard cell 110. As shown in FIG. 2, the standard cell 110 is composed of a power supply section 111, a logic circuit section 112, and a ground section 113. The standard cell 110 is arranged on the cell track, using the power supply section 111, the logic circuit section 112 and the ground section 113 as a unit.

FIGS. 3A to 3C show the arrangement of the conventional standard cells. FIG. 3A shows the state in which three standard cells 110a are arranged on a cell track T10, and three standard cells 110b are arranged on a cell track T11. The ground sections 113b of the standard cells 110b overlap the ground terminal sections 113a of the standard cells 110a. Thus, the ground sections 113b of the standard cells 110b are arranged on the cell track T10.

When a wiring track T12 should be provided between the cell track T10 and the cell track T11 after the standard cells 110a and 110b have been arranged, the overlapping of the ground terminal sections 113a and the ground terminal sections 113b are first eliminated, as shown in FIG. 3B. Then, the region of the cell track T11 is moved, so that the wiring track T12 is formed, as shown in FIG. 3C.

If the power supply sections or the ground sections are arranged between the adjacent cell tracks such that they are used in common, the arrangement region will be used more effectively. If a wiring track should be arranged between the cell tracks, the power supply sections or the ground sections are independently arranged. In this case, however, the arrangement region cannot be utilized effectively.

Also, it is desired that the height of the power supply section or ground section, namely, the dimension in the direction in which the power supply section and the ground section are aligned in the standard cell, can be selected optionally. Also, it is desirable that the amount of current that flows in the standard cell can be selected optionally. For this purpose, it is necessary to provide a plurality of standard cells for every logic circuit. The standard cells are different power supply sections and different ground sections in height and permissible current value. For this reason, a great number of standard cells need to be registered in the cell library, so that a selecting operation of standard cells is complicated in case of arrangement of the standard cell.

SUMMARY OF THE INVENTION

Therefore, an object of the present invention is to provide a computer-aided design supporting system in which power supply cell patterns, logic cell patterns and ground cell patterns can be arranged individually and independently.

Another object of the present invention is to provide a computer-aided design supporting system in which an arranged power supply cell pattern, an arranged logic cell pattern and an arranged ground cell pattern are automatically connected to each other.

Still another object of the present invention is to provide a computer-aided design supporting system in which an arranged power supply cell pattern, an arranged logic cell pattern and an arranged ground cell pattern constitutes a pattern of a logic device as a unit.

Yet still another object of the present invention is to provide a computer-aided design supporting system in which an arranged power supply cell pattern, an arranged logic cell pattern and an arranged ground cell pattern can be changed or moved as a unit.

It is an object of the present invention to provide a computer-aided design supporting system in which a cell track and a wiring track can be effectively arranged.

In order to achieve an aspect of the present invention, a computer-aided design supporting system for a semiconductor device includes a cell library, an arranging tool and a wiring tool. The cell library stores a plurality of logic cell patterns, a plurality of power supply cell patterns, and a plurality of ground cell patterns. A logic device pattern of the semiconductor device includes one of the plurality of logic cell patterns, one of the plurality of power supply cell patterns, and one of the plurality of ground cell patterns. The arranging tool arranges selected ones of the plurality of logic cell patterns, selected ones of the plurality of power supply cell patterns and selected ones of the plurality of ground cell patterns on cell tracks individually and independently in response to an arrange instruction. The wiring tool connects between the selected logic cell patterns, between the selected power supply cell patterns and between the selected ground cell patterns arranged on the cell tracks in response to a wiring instruction to form a pattern of the semiconductor device.

Here, a pattern of a specific logic device may include a specific one of the selected logic cell patterns, a specific one of the selected power supply cell patterns and a specific one of the selected ground cell patterns. Also, it is supposed that after one of the specific logic cell pattern, a specific power supply cell pattern and a specific ground cell pattern is arranged by the arranging tool, another may be arranged by the arranging tool with respect to the one cell pattern. In this case, the one cell pattern and the other cell pattern are automatically connected.

Also, it is desirable that the plurality of power supply cell patterns are grouped in a plurality of groups, and the plurality of ground cell patterns are grouped in a plurality of groups. In this case, the plurality of groups for the plurality of power supply cell patterns may be different from each other in at least one of a height of cell pattern, the number of power supply lines, and a permissible current value. In addition, the plurality of groups for the plurality of ground cell patterns may be different from each other in at least one of a height of cell pattern, the number of ground lines, and a permissible current value.

Also, the arranging tool may include a logic cell tool, a power supply cell tool and a ground cell tool. The logic cell tool arranges each of the selected logic cell patterns on either of the cell tracks in response to a logic cell arrangement instruction. The power supply cell tool arranges each of the selected power supply cell patterns on either of the cell tracks in response to a power supply cell arrangement instruction. The ground cell tool arranges each of the selected ground cell patterns on either of the cell tracks in response to a ground cell arrangement instruction.

Also, a specified logic device may include a specified one of the selected logic cell patterns, a specified one of the selected power supply cell patterns and a specific one of the selected ground cell patterns. In this case, the arranging tool transforms the specified logic device pattern in response to a move instruction while maintaining connections between the cell patterns such that the specified logic cell pattern and one of the specific power supply cell pattern and the specific ground cell pattern are automatically moved as a unit. In this case, when the move instruction is related to the specified logic cell pattern and the specified power supply cell pattern, the logic cell tool moves the specified logic cell pattern in response to the move instruction. In addition, the power cell tool moves the specified power supply cell pattern in response to the move instruction, and the ground cell tool maintaining connection between the specified logic cell pattern and the specified ground cell pattern. Alternatively, when the move instruction is related to the specified logic cell pattern and the specified ground cell pattern, the logic cell tool moves the specified logic cell pattern in response to the move instruction. In addition, the ground tool moves the specified ground cell pattern in response to the move instruction, and the power supply cell tool maintaining connection between the specified logic cell pattern and the specified power supply cell pattern.

In another aspect of the present invention, a computer-aided design supporting method for a semiconductor device is attained by providing a cell library which stores a plurality of logic cell patterns, a plurality of power supply cell patterns, and a plurality of ground cell patterns, wherein a logic device pattern of the semiconductor device includes one of the plurality of logic cell patterns, one of the plurality of power supply cell patterns, and one of the plurality of ground cell patterns; by arranging selected ones of the plurality of logic cell patterns, selected ones of the plurality of power supply cell patterns and selected ones of the plurality of ground cell patterns on cell tracks individually and independently in response to an arrange instruction; and by connecting between the selected logic cell patterns, between the selected power supply cell patterns and between the selected ground cell patterns arranged on the cell tracks in response to a wiring instruction to form a pattern of the semiconductor device.

Here, a pattern of a specific logic device may include a specific one of the selected logic cell patterns, a specific one of the selected power supply cell patterns and a specific one of the selected ground cell patterns. Also, after one of the specific logic cell pattern, a specific power supply cell pattern and a specific ground cell pattern is arranged by the arranging tool, another may be arranged by the arranging tool with respect to the one cell pattern. In this case, the arrangement is attained by automatically connecting the one cell pattern and the other cell pattern.

Also, the plurality of power supply cell patterns may be grouped in a plurality of groups, and the plurality of ground cell patterns may be grouped in a plurality of groups. In this case, it is desirable that the plurality of groups for the plurality of power supply cell patterns are different from each other in at least one of a height of cell pattern, the number of power supply lines, and a permissible current value. In addition, it is desirable that the plurality of groups for the plurality of ground cell patterns are different from each other in at least one of a height of cell pattern, the number of ground lines, and a permissible current value.

Also, the arrangement may be attained by arranging each of the selected logic cell patterns on either of the cell tracks by a logic cell tool in response to a logic cell arrangement instruction; by arranging each of the selected power supply cell patterns on either of the cell tracks by a power supply cell tool in response to a power supply cell arrangement instruction; and by arranging each of the selected ground cell patterns on either of the cell tracks by a ground cell tool in response to a ground cell arrangement instruction.

In addition, when a specified logic device include a specified one of the selected logic cell patterns, a specified one of the selected power supply cell patterns and a specific one of the selected ground cell patterns, the method may further include a method attained by transforming the specified logic device pattern in response to a move instruction while maintaining connections between the cell patterns such that the specified logic cell pattern and one of the specific power supply cell pattern and the specific ground cell pattern are automatically moved as a unit. In this case, when the move instruction is related to the specified logic cell pattern and the specified power supply cell pattern, the transformation may be attained by moving the specified logic cell pattern in response to the move instruction. In addition, the transformation may be attained by moving the specified power supply cell pattern in response to the move instruction, and by maintaining connection between the specified logic cell pattern and the specified ground cell pattern. Instead, when the move instruction is related to the specified logic cell pattern and the specified ground cell pattern, the transformation may be attained by moving the specified logic cell pattern in response to the move instruction. In addition, the transformation may be attained by moving the specified ground cell pattern in response to the move instruction, and maintaining connection between the specified logic cell pattern and the specified power supply cell pattern.

In order to achieve still another aspect of the present invention, a recording medium which stores a cell library having a plurality of logic cell patterns, a plurality of power supply cell patterns, and a plurality of ground cell patterns. In this case, a logic device pattern of the semiconductor device includes one of the plurality of logic cell patterns, one of the plurality of power supply cell patterns, and one of the plurality of ground cell patterns. The recording medium also stores a program stores for a method which is attained by arranging selected ones of the plurality of logic cell patterns, selected ones of the plurality of power supply cell patterns and selected ones of the plurality of ground cell patterns on cell tracks individually and independently in response to an arrange instruction; and by connecting between the selected logic cell patterns, between the selected power supply cell patterns and between the selected ground cell patterns arranged on the cell tracks in response to a wiring instruction to form a pattern of the semiconductor device.

Here, a pattern of a specific logic device may include a specific one of the selected logic cell patterns, a specific one of the selected power supply cell patterns and a specific one of the selected ground cell patterns, and after one of the specific logic cell pattern, a specific power supply cell pattern and a specific ground cell pattern is arranged by the arranging tool, another may be arranged by the arranging tool with respect to the one cell pattern. In this case, the arrangement may be attained by automatically connecting the one cell pattern and the other cell pattern.

Also, the arrangement may be attained by arranging each of the selected logic cell patterns on either of the cell tracks by a logic cell tool in response to a logic cell arrangement instruction; by arranging each of the selected power supply cell patterns on either of the cell tracks by a power supply cell tool in response to a power supply cell arrangement instruction; and by arranging each of the selected ground cell patterns on either of the cell tracks by a ground cell tool in response to a ground cell arrangement instruction.

Also, when a specified logic device includes a specified one of the selected logic cell patterns, a specified one of the selected power supply cell patterns and a specific one of the selected ground cell patterns, the method may further include transforming the specified logic device pattern in response to a move instruction while maintaining connections between the cell patterns such that the specified logic cell pattern and one of the specific power supply cell pattern and the specific ground cell pattern are automatically moved as a unit.

BRIEF DESCRIPTION OF THE DRAWINGS

FIGS. 3A to 3C are diagrams showing arrangements of the conventional standard cells;

FIGS. 5A to 5E are diagrams showing the structure of types of standard cells used in the embodiment of the present invention;

DESCRIPTION OF THE PREFERRED EMBODIMENTS

Hereinafter, a computer-aided design supporting system of the present invention will be described below in detail with reference to the attached drawings.

Figure 1:
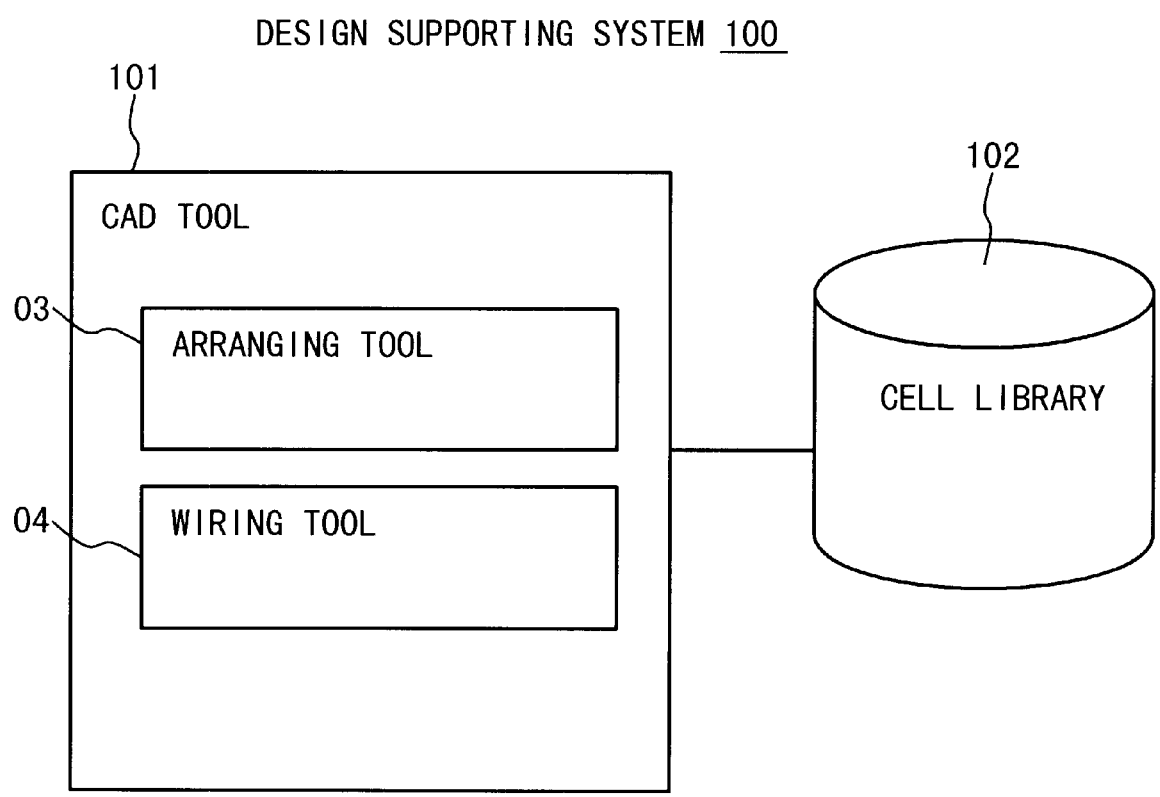
FIG. 1 is a diagram showing the structure of a conventional computer-aided design supporting system.
Figure 2:
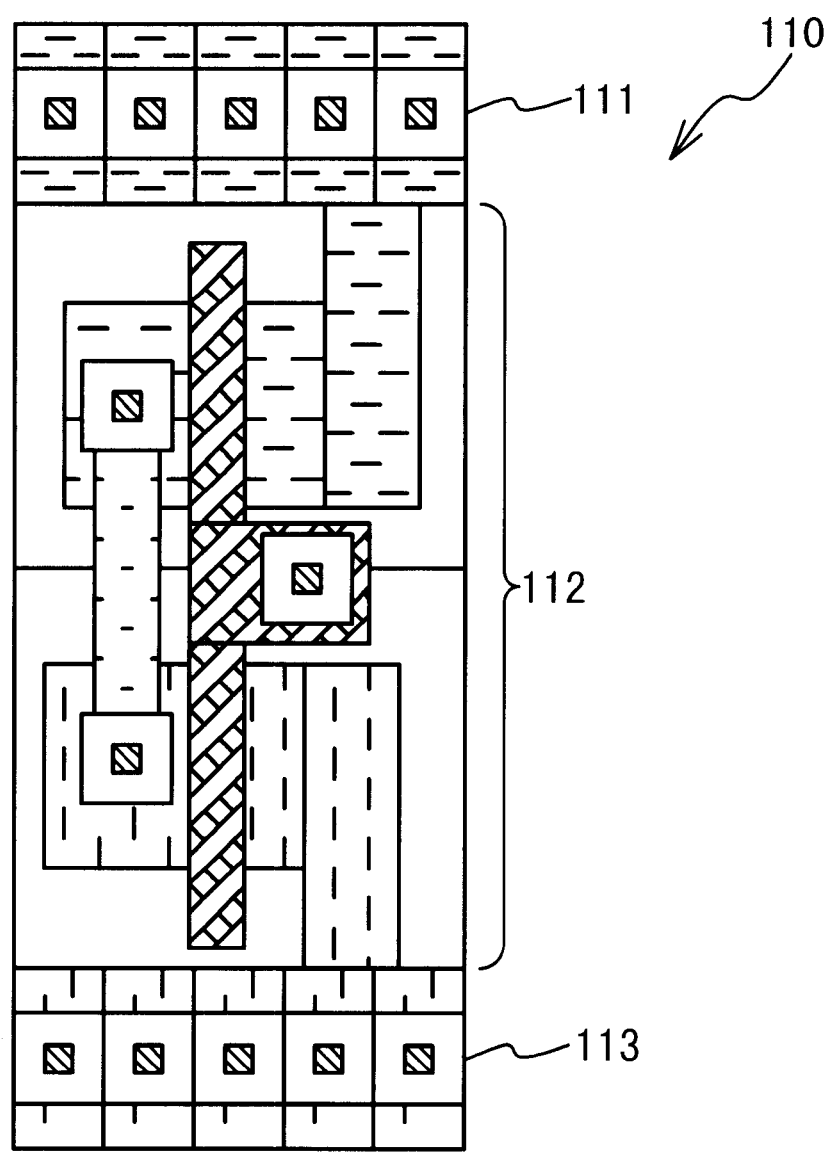
FIG. 2 is a diagram showing a conventional standard cell.
Figure 4:
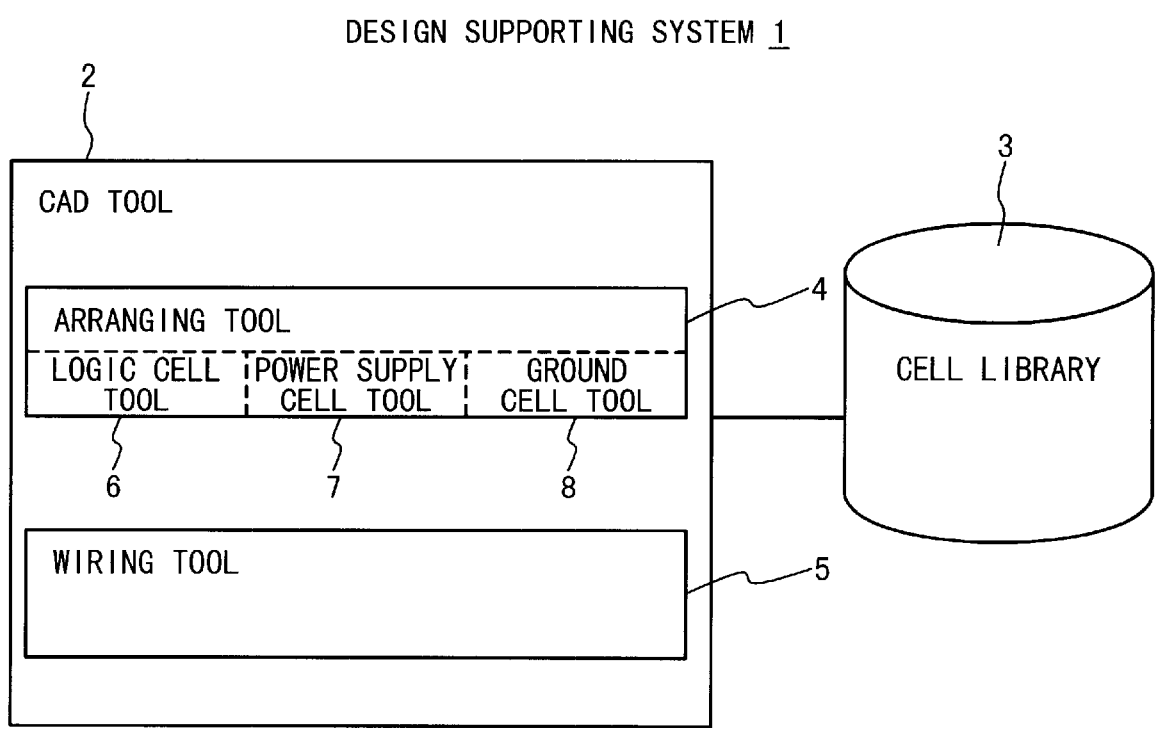
FIG. 4 is a block diagram showing the structure of a computer-aided design supporting system according to an embodiment of the present invention.

FIG. 4 shows the structure of a computer-aided design supporting system 1 according to an embodiment of the present invention. The computer-aided design supporting system 1 is composed of a CAD tool 2 and a cell library 3. The CAD tool 2 is composed of an arranging tool 4 and a wiring tool 5. The arranging tool 4 has a logic cell tool 6, a power supply cell tool 7 and a ground cell tool 8.

The cell library 3 stores a plurality of types of standard logic cell patterns, a plurality of types of standard power supply cell patterns and a plurality of types of ground cell patterns. The plurality of types of standard power supply cell patterns are different from each other in height, the number of power supply lines or permissible current value. The plurality of types of ground cell patterns are different from each other in height, the number of ground lines or permissible current value. A pattern of a logic device is composed of a set of a power supply cell pattern, a logic cell pattern and a ground cell pattern.

The CAD tool 2 is a processor that carries out the automatic arrangement and connection of cell patterns. The arranging tool 4 reads out the standard cell pattern from the cell library 3 in response to an arrange instruction individually and independently. The arranging tool 4 automatically arranges the read out standard cell pattern on a cell track provided in an arrangement region. The wiring tool 5 automatically connects between the standard cell patterns for different logic device patterns on the cell track, and between the standard cell patterns and wiring lines on the wiring track in the arrangement region.

The logic cell tool 6 arranges a standard logic cell pattern in response to a logic cell arrange instruction of the arrange instruction. The power supply cell tool 7 arranges a standard power supply cell pattern in response to a power supply cell arrange instruction of the arrange instruction. The ground cell tool 8 arranges a standard ground cell pattern in response to a ground cell arrange instruction of the arrange instruction.

FIGS. 5A to 5E show the structure of the standard cell pattern according to the present invention. As shown in FIGS. 5A to 5E, the cell library 3 has the first standard power supply cell pattern 70a and the second standard power supply cell pattern 70b as the standard cell patterns. The cell library 3 further has a standard cell pattern 60 as the standard cell pattern. Still further, the cell library 3 has the first standard ground cell pattern 80a and the second standard ground cell pattern 80b as the standard cell patterns. The first standard power supply cell pattern 70a and the first standard ground cell pattern 80a are small current cell patterns. The second standard power supply cell pattern 70b and the second standard ground cell pattern 80b are large current cell patterns.

Referring to FIG. 5A, the standard logic cell pattern 60 is arranged on a cell track by the logic cell tool 6 in response to the logic cell arrange instruction. The standard power supply cell patterns 71 to 75 are arranged above the standard logic cell pattern 60 by the power supply cell tool 7 and the standard ground cell patterns 81 to 85 are arranged under the standard logic cell pattern G0 by the ground cell tool 8. At this time, when the standard power supply cell 70 is arranged adjacent to the standard logic cell pattern 60 on the cell track in response to the power supply cell arranging instruction, a wiring line pattern of the power supply cell pattern 75 is connected to a wiring line pattern of the standard logic cell pattern 60 by the power supply cell tool 7. Also, when the standard ground cell 80 is arranged adjacent to the standard logic cell pattern 60 on the cell track in response to the ground cell arranging instruction, a wiring line pattern of the ground cell pattern 85 is connected to a wiring line pattern of the standard logic cell pattern 60 by the ground cell tool 7. Thus, the standard power supply cell 70, the standard logic cell pattern 60 and the standard ground cell 80 are made unitary as a pattern of a logic device. As described above, the standard logic cell pattern 60 has neither a power supply cell pattern nor a ground cell pattern. The standard logic cell pattern 60 is used in combination with the standard power supply cell pattern and the standard ground cell pattern.

Figure 6A:
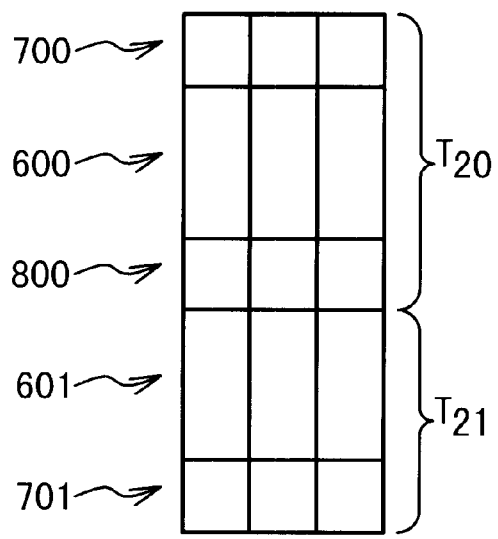
FIGS. 6A to 6D are diagrams showing change of the arrangement of the standard cells of the present invention.
Figure 6B:
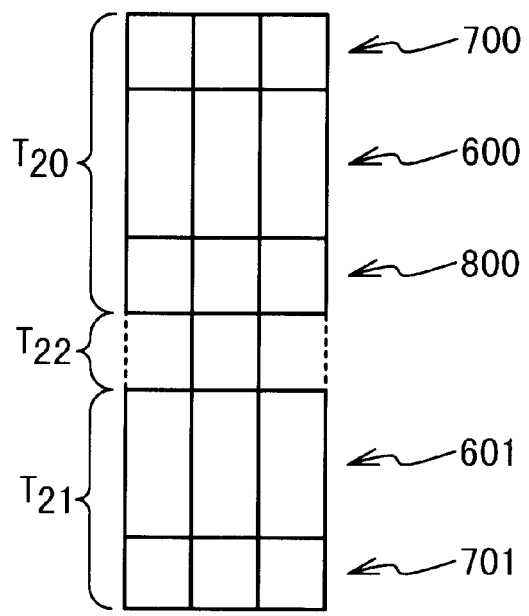

FIG. 6A shows an arrangement of the standard cell patterns according to the embodiment of the present invention. FIG. 6B shows a rearrangement of the standard cell patterns in which a wiring track is newly provided between two adjacent cell tracks. As shown in FIG. 6A, there are arranged a logic cell pattern group 600 composed of three standard logic cell patterns, a power supply cell pattern group 700 composed of three standard power supply cell patterns and a ground cell pattern group 800 composed of six ground cell patterns on a cell track T20. Further, there are arranged a logic cell pattern group 601 composed of three standard logic cells and a power supply cell pattern group 701 composed of three standard power supply cell patterns on a cell track T21. Of the six standard ground cell patterns of the group 800, the first three are connected to the three standard logic cell patterns of the logic cell pattern group 600, respectively. Also, the remaining three are connected to the three standard logic cell patterns of the logic cell pattern group 601, respectively. The remaining three standard ground cell patterns are arranged to overlap the first three standard ground cell patterns. In this case, the power supply cell tool 7 controls the arrangement of the standard power supply cell patterns. Also, the logic cell tool 6 controls the arrangement of the standard logic cell patterns, and the ground cell tool 8 controls the arrangement of the standard ground cell patterns.

When a wiring track T22 should be provided between the cell tracks T20 and T21 after the groups of cell patterns are arranged, the power supply cell pattern group 701 is moved by the power supply cell tool 7 in response to a change (move) instruction. At this time, the arranging tool 4 temporarily stored a movement quantity of the power supply cell group 701. Then, the logic cell tool 6 is automatically initiated after the operation of the power supply cell tool 7. Thus, the logic cell pattern group 601 is moved by the movement quantity by the logic cell tool 6. In this case, wiring line patterns extend from the standard ground cell patterns to the standard logic cell patterns. Thus, the ground cell tool 8 maintains the respective connections between the ground cell pattern group 800 and the logic cell pattern group 601. As a result, the wiring track T22 is formed by moving the power supply cell pattern group 701 and logic cell pattern group 601, as shown in FIG. 6B.

Thereafter, the wiring tool 5 is initiated so that the ground cell patterns are connected to wiring lines of the wiring track T22.

Figure 6C:
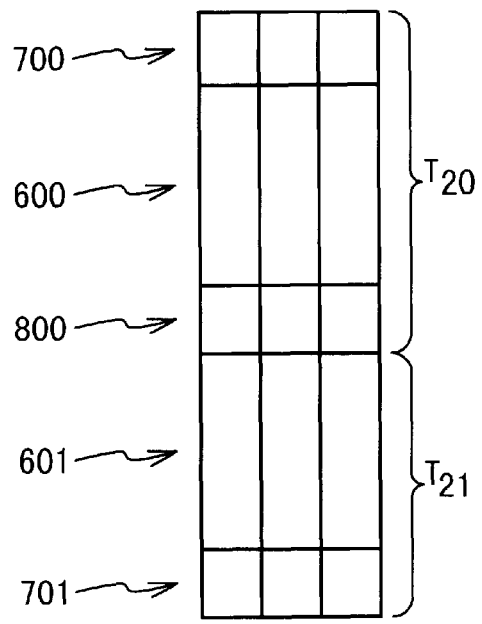
Figure 6D:
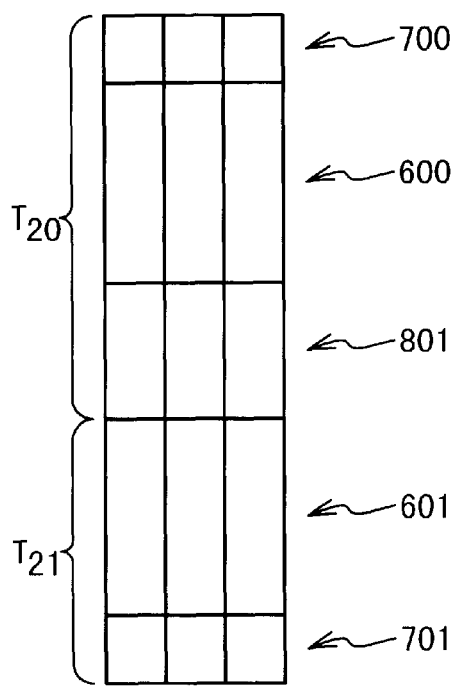

FIG. 6C shows the arrangement of the standard cell patterns according to the embodiment of the present invention. This figure is similar to FIG. 6A. FIG. 6D shows an arrangement of the standard cell patterns in which the standard ground cell patterns of the ground cell pattern group are changed in height. As shown in FIG. 6D, there are arranged a logic cell pattern group 600 composed of three standard logic cell patterns, a power supply cell pattern group 700 composed of three standard power supply cell patterns and a ground cell pattern group 800 composed of six ground cell patterns on a cell track T20. Further, there are arranged a logic cell pattern group 601 composed of three standard logic cells and a power supply cell pattern group 701 composed of three standard power supply cell patterns on a cell track T21. Of the six standard ground cell patterns of the group 800, the first three are connected to the three standard logic cell patterns of the logic cell pattern group 600, respectively. Also, the remaining three are connected to the three standard logic cell patterns of the logic cell pattern group 601, respectively. The remaining three standard ground cell patterns are arranged to overlap the first three standard ground cell patterns. In this case, the power supply cell tool 7 controls the arrangement of the standard power supply cell patterns. Also, the logic cell tool 6 controls the arrangement of the standard logic cell patterns, and the ground cell tool 8 controls the arrangement of the standard ground cell patterns.

The ground cell tool 8 receives a change instruction to change the ground cell pattern of the group 800 in height. At this time, the ground cell tool 8 carries out a changing process of all the ground cell patterns of the group 800 at a time. For example, when the cell patterns of the ground cell pattern group 800 are changed to the second standard cell patterns 80b, the ground cell tool 8 reads the second standard ground cell patterns 80b from the cell library 3 in response to a change (substitute) instruction. Then, the tool 8 arranges the second standard ground cell patterns 80b in the ground cell pattern group 800 in place of the first standard ground cell patterns 80a, as shown in FIG. 6D. In this case, prior to the ground cell tool 8, the power supply cell tool 7 and the logic cell tool 6 are started. The power supply cell pattern group 701 is moved by the power supply cell tool 7 in response to a change (move) instruction. At this time, the arranging tool 4 temporarily stored a movement quantity of the power supply cell group 701. Then, the logic cell tool 6 is automatically initiated after the operation of the power supply cell tool 7. Thus, the logic cell pattern group 601 is moved by the movement quantity by the logic cell tool 6. Then the ground cell tool 8 is started to substitute the second standard ground cell patterns 80b for the first standard ground cell patterns 80a, as shown in FIG. 6D. As a result, wiring line patterns of the standard ground cell patterns of the group 801 are connected to the wiring line patterns of the standard logic cell patterns of the group 601.

Thereafter, the wiring tool 5 is initiated so that the standard ground cell patterns are connected to wiring lines of the wiring track T22.

Figure 7:
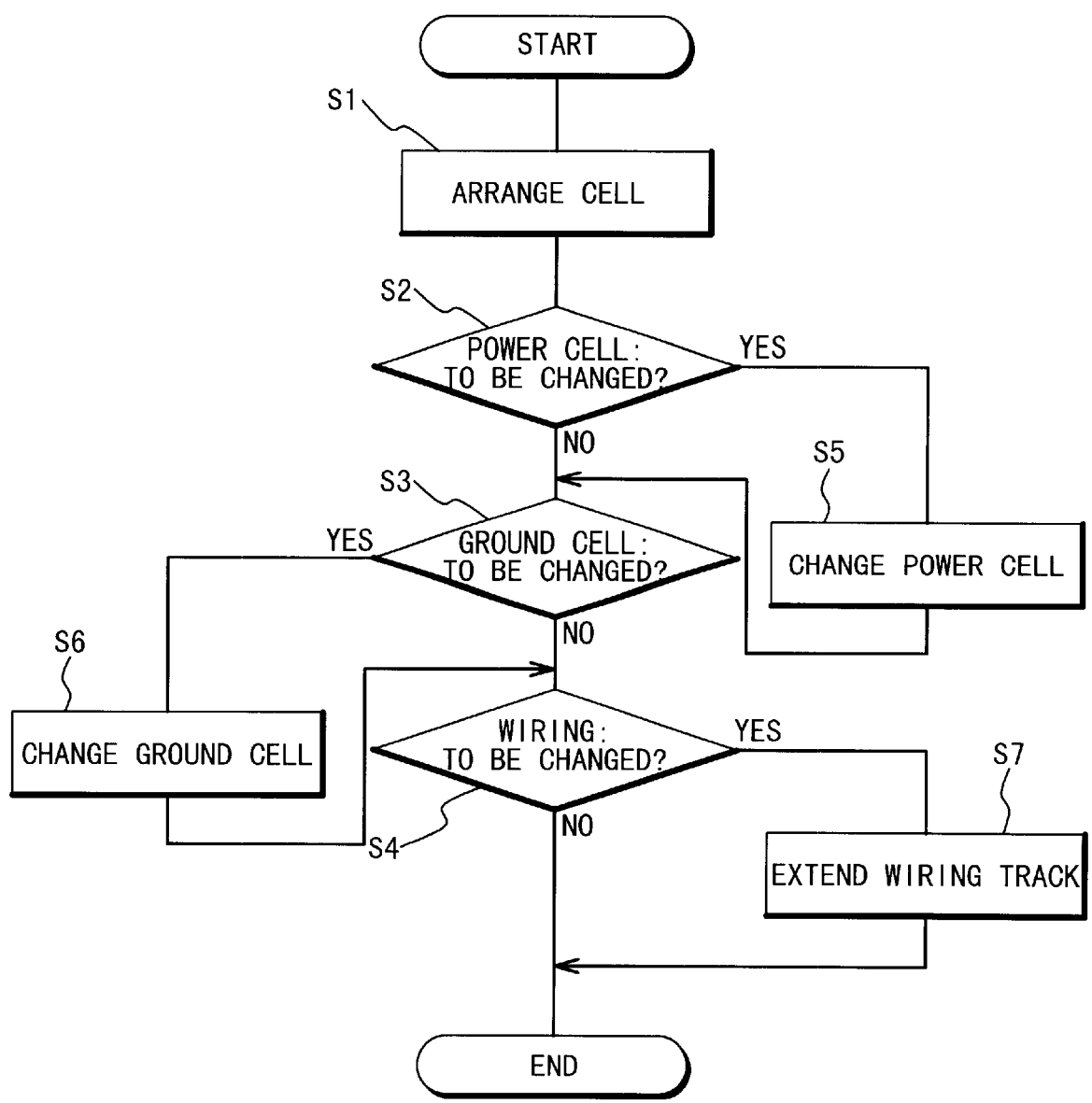
FIG. 7 is a flow chart showing the operation of an arranging tool of the present invention.

Next, FIG. 7 is a flowchart showing the operation of the arranging tool 4 of the present invention. Upon receipt of a cell pattern arranging instruction, the logic cell tool 6 of the tool 4 reads the standard logic cell pattern 60 from the cell library 3 to arrange on a predetermined cell track. Similarly, the power supply cell tool 7 reads the standard power supply cell patterns 70a and 70b from the cell library 3 to arrange on the predetermined cell track. Similarly, the ground cell tool 8 reads the standard ground cell patterns 80a and 80b from the cell library 3 to arrange on the predetermined cell track (Step S1).

The power supply cell tool 7 monitors an instruction for changing the standard power supply cell patterns (Step S2). To change the standard power supply cell patterns is to change the cell pattern 70a to the cell pattern 70b, and the cell pattern 70b to the cell pattern 70a. As long as no instruction for changing the standard power supply cell patterns is generated, the ground cell tool 8 keeps monitoring an instruction for changing the standard ground cell patterns (Step S3). To change the standard ground cell patterns is to change the cell pattern 80a to the cell pattern 80b, and the cell pattern 80b to the cell pattern 80a. As long as no instructions for changing the standard ground cell patterns is generated, the logic cell tool 6 keeps monitoring an instruction for moving the cell track (Step S3). The cell track is moved when it is necessary to provide a new wiring track, to expand the existing wiring track or to compress the same. As long as no instruction for moving the cell track is generated, the arranging tool 4 keeps waiting for a new instruction.

Upon detecting an instruction for changing the standard power supply cell patterns, the power supply cell tool 7 reads a new standard power supply cell pattern from the cell library 3. The power supply cell tool 7 arranges the new standard power supply cell pattern on a predetermined power supply cell pattern group, as described above (Step S5).

Upon detecting an instruction for changing the standard ground cell patterns, the ground cell tool 8 reads a new standard ground cell pattern from the cell library 3. The tool 8 arranges a new standard ground cell pattern on a predetermined ground cell pattern group, as described above (Step S6).

Upon detecting an instruction for moving the cell track, the logic cell tool 6, the power supply cell tool 7 and the ground cell tool 8 rearrange the standard logic cell patterns, the standard power supply cell patterns and the standard ground cell patterns on a new cell track (Step S7).

As has been described, the computer-aided design supporting system according to the present invention can change, substitute and move the standard logic cell patterns, standard power supply cell patterns and standard ground cell patterns in association with any other cell patterns. Also, after the standard power supply cell pattern and the standard ground cell pattern can be used in common to each other after they are moved. Therefore, it eliminates the arrangement space by moving the cell patterns.

In the computer-aided design supporting system of the present invention, it is unnecessary to prepare various types of power supply cell patterns or ground cell patterns for one type of a logic cell pattern. This allows the decreases of the number of cell patterns that should be registered in the cell library. For example, from 400 (types of logic cell patterns)×N to (400+n), where n is the number of types of power supply and ground cell patterns. The reduction of the number of cell patterns to be stored in the cell library leads the shorter retrieval time of any desired cell patterns.

Since the freedom of arrangement of the standard ground cell patterns increases, the grounding position can be located far from the grounding position to the substrate with respect to the logic cell pattern. Hence, the effect of measures to noise at the substrate can be obtained.

The present invention is not limited to the embodiments described above. For example, the standard power supply cell patterns and the standard ground cell patterns, which are registered in the cell library, need not be limited to two types. Rather, the cell library may store more types of standard power supply cell patterns and standard ground cell patterns. Moreover, more standard logic cell patterns may be registered in the cell library in accordance with the logic function. Furthermore, the standard power supply cell patterns and the standard logic ground cell patterns are not limited in height and the number of wiring lines. Also, the standard power supply cell patterns and the standard logic ground cell patterns may have larger permissible current values when they are arranged on locations nearer to the power supply point. The taller one and shorter one, one having many wiring lines and one having few wiring lines, or one having a large permissible current value and one having a small permissible current value may be alternately arranged.

The computer-aided design supporting system according to the present invention can realize the efficient arrangement of cell tracks and wiring tracks. Moreover, the system according to the invention can reduce the number of cell patterns that should be registered in the cell library.

What is claimed is:

1. A computer-aided design supporting system for a semiconductor device comprising:

a cell library storing a plurality of logic cell patterns, a plurality of power supply cell patterns that are different from each other, and a plurality of ground cell patterns that are different from each other, wherein a logic device pattern of said semiconductor device includes one of said plurality of logic cell patterns, one of said plurality of power supply cell patterns, and one of said plurality of ground cell patterns;

an arranging tool which arranges selected ones of said plurality of logic cell patterns, selected ones of said plurality of power supply cell patterns and selected ones of said plurality of ground cell patterns on cell tracks individually and independently in response to an arrange instruction; and a wiring tool which connects between said selected logic cell patterns, between said selected power supply cell patterns and between said selected ground cell patterns arranged on said cell tracks in response to a wiring instruction to form a pattern of said semiconductor device.

2. The computer-aided design supporting system according to claim 1, wherein a pattern of a specific logic device comprises a specific one of said selected logic cell patterns, a specific one of said selected power supply cell patterns and a specific one of said selected ground cell patterns, and after one of said specific logic cell pattern, a specific power supply cell pattern and a specific ground cell pattern is arranged by said arranging tool, another is arranged by said arranging tool with respect to said one cell pattern, and said one cell pattern and said another cell pattern are automatically connected.

3. The computer-aided design supporting system according to claim 1, wherein said plurality of power supply cell patterns are grouped in a plurality of groups, and said plurality of ground cell patterns are grouped in a plurality of groups.

4. The computer-aided design supporting system according to claim 3, wherein said plurality of groups for said plurality of power supply cell patterns are different from each other in at least one of a height of cell pattern, the number of power supply lines, and a permissible current value, and said plurality of groups for said plurality of ground cell patterns are different from each other in at least one of a height of cell pattern, the number of ground lines, and a permissible current value.

5. The computer-aided design supporting system according to claim 1, wherein said arranging tool comprises:

a logic cell tool which arranges each of said selected logic cell patterns on either of said cell tracks in response to a logic cell arrangement instruction;

a power supply cell tool which arranges each of said selected power supply cell patterns on either of said cell tracks in response to a power supply cell arrangement instruction; and a ground cell tool which arranges each of said selected ground cell patterns on either of said cell tracks in response to a ground cell arrangement instruction.

6. The computer-aided design supporting system according to claim 5, wherein a specified logic device comprising a specified one of said selected logic cell patterns, a specified one of said selected power supply cell patterns and a specific one of said selected ground cell patterns, and said arranging tool transforms said specified logic device pattern in response to a move instruction while maintaining connections between said cell patterns such that said specified logic cell pattern and one of said specific power supply cell pattern and said specific ground cell pattern are automatically moved as a unit.

7. The computer-aided design supporting system according to claim 6, wherein said move instruction is related to said specified logic cell pattern and said specified power supply cell pattern, said logic cell tool moves said specified logic cell pattern in response to said move instruction, said power supply cell tool moves said specified power supply cell pattern in response to said move instruction, and said ground cell tool maintaining connection between said specified logic cell pattern and said specified ground cell pattern.

8. The computer-aided design supporting system according to claim 6, wherein said move instruction is related to said specified logic cell pattern and said specified ground cell pattern, said logic cell tool moves said specified logic cell pattern in response to said move instruction, said ground tool moves said specified ground cell pattern in response to said move instruction, and said power supply cell tool maintaining connection between said specified logic cell pattern and said specified power supply cell pattern.

9. A computer-aided design supporting method for a semiconductor device comprising:

providing a cell library which stores a plurality of logic cell patterns, a plurality of power supply cell patterns that are different from each other, and a plurality of ground cell patterns that are different from each other, wherein a logic device pattern of said semiconductor device includes one of said plurality of logic cell patterns, one of said plurality of power supply cell patterns, and one of said plurality of ground cell patterns;

arranging selected ones of said plurality of logic cell patterns, selected ones of said plurality of power supply cell patterns and selected ones of said plurality of ground cell patterns on cell tracks individually and independently in response to an arrange instruction; and connection between said selected logic cell patterns, between said selected power supply cell patterns and between said selected ground cell patterns arranged on said cell tracks in response to a wiring instruction to form a pattern of said semiconductor device.

10. The computer-aided design supporting method according to claim 9, wherein a pattern of a specific logic device comprises a specific one of said selected logic cell patterns, a specific one of said selected power supply cell patterns and a specific one of said selected ground cell patterns, and after one of said specific logic cell pattern, a specific power supply cell pattern and a specific ground cell pattern is arranged by said arranging tool, another is arranged by said arranging tool with respect to said one cell pattern, and said arranging includes:

automatically connecting said one cell pattern and said another cell pattern.

11. The computer-aided design supporting method according to claim 9, wherein said plurality of power supply cell patterns are grouped in a plurality of groups, and said plurality of ground cell patterns are grouped in a plurality of groups.

12. The computer-aided design supporting method according to claim 11, wherein said plurality of groups for said plurality of power supply cell patterns are different from each other in at least one of a height of cell pattern, the number of power supply lines, and a permissible current value, and said plurality of groups for said plurality of ground cell patterns are different from each other in at least one of a height of cell pattern, the number of ground lines, and a permissible current value.

13. The computer-aided design supporting method according to claim 9, wherein said arranging includes:

arranging each of said selected logic cell patterns on either of said cell tracks by a logic cell tool in response to a logic cell arrangement instruction;

arranging each of said selected power supply cell patterns on either of said cell tracks by a power supply cell tool in response to a power supply cell arrangement instruction; and arranging each of said selected ground cell patterns on either of said cell tracks by a ground cell tool in response to a ground cell arrangement instruction.

14. The computer-aided design supporting method according to claim 13, wherein a specified logic device comprising a specified one of said selected logic cell patterns, a specified one of said selected power supply cell patterns and a specific one of said selected ground cell patterns, and said method further comprises:

transforming said specified logic device pattern in response to a move instruction while maintaining connections between said cell patterns such that said specified logic cell pattern and one of said specific power supply cell pattern and said specific ground cell pattern are automatically moved as a unit.

15. The computer-aided design supporting method according to claim 14, wherein said move instruction is related to said specified logic cell pattern and said specified power supply cell pattern, said transforming includes:

moving said specified logic cell pattern in response to said move instruction, moving said specified power supply cell pattern in response to said move instruction, and maintaining connection between said specified logic cell pattern and said specified ground cell pattern.

16. The computer-aided design supporting method according to claim 14, wherein said move instruction is related to said specified logic cell pattern and said specified ground cell pattern, said transforming includes:

moving said specified logic cell pattern in response to said move instruction, moving said specified ground cell pattern in response to said move instruction, and maintaining connection between said specified logic cell pattern and said specified power supply cell pattern.

17. A recording medium which stores a cell library having a plurality of logic patterns, a priority of power supplies cell patterns, and a priority of ground cell patterns, wherein a logic device pattern of said semiconductor device includes one of said priority of logic cell patterns, one of said priority of power supplies cell patterns, and one of said priority of ground cell patterns, and in which program for method is stored, wherein said method comprises:

arranging selected ones of said plurality of logic cell patterns, selected ones said plurality of power supplies cell patterns and selected ones of said quality of ground cell patterns on cell tracks individually and independently in response to an arranged instruction; and connecting between said selected logic cell patterns, between selected power supply cell patterns aimed between said selected ground cell patterns arranged on said cell tracks in response to a wiring instruction to form a pattern of said semiconductor device, wherein said arranging includes:

arranging each of said selected logic cell patterns on either of said cell tracks by a logic cell tool in response to a logic cell arrangement instruction;

arranging each of said selected power supply cell patterns on either of said cell tracks by a power supply cell tool in response to a power supply cell arrangement instruction; and arranging each of said selected ground cell patterns on either of said cell tracks by a ground cell tool in response to a ground cell arrangement instruction.

18. The recording medium according to claim 17, wherein a pattern of a specific logic device comprises a specific one of said selected logic cell patterns, a specific one of said selected power supply cell patterns and a specific one of said selected ground cell patterns, and after one of said specific logic cell pattern, a specific power supply cell pattern and a specific ground cell pattern is arranged by said arranging tool, another is arranged by said arranging tool with respect to said one cell pattern, and said arranging includes:

automatically connecting said one cell pattern and said another cell pattern.

19. The recording medium according to claim 17, wherein a specified logic device comprising a specified one of said selected logic cell patterns, a specified one of said selected power supply cell patterns and a specific one of said selected ground cell patterns, and said method further comprises:

transforming said specified logic device pattern in response to a move instruction while maintaining connections between said cell patterns such that said specific logic cell pattern and one of said specific power supply cell pattern and said specific ground cell pattern are automatically moved as a unit.

20. A computer-aided design supporting system for a semiconductor device comprising:

a cell library storing a plurality of logic cell patterns, a plurality of power supply cell patterns, and a plurality of ground cell patterns, wherein a logic device pattern of said select semiconductor device includes one of said plural logic cell patterns, one of said plural of power supply cell patterns, and one of said plural of ground cell patterns;

an arranging tool which arranges only selected ones of said plural power supply cell patterns in response to an arrange instruction; and a wiring tool which connects between said selected logic cell patterns, between said selected power supply cell patterns and between said selected ground cell patterns arranged on said cell tracks in response to a wiring instruction to form a pattern of said semiconductor device.

21. The computer-aided design supporting system according to claim 20, further comprising an arranging tool which arranges only selected ones of said plurality of ground cell patterns on cell tracks in response to another arrange instruction.

22. The computer-aided design supporting system according to claim 21, further comprising an arranging tool which arranges only selected ones of said plurality of logic cell patterns on cell tracks in response to yet another arrange instruction.

* * * * *